(12) United States Patent
Hyodo et al.

(10) Patent No.: US 6,838,765 B2
(45) Date of Patent: Jan. 4, 2005

(54) SEMICONDUCTOR DEVICE AND MANUFACTURING METHOD THEREOF

(75) Inventors: Haruo Hyodo, Gunma (JP); Shigeo Kimura, Gunma (JP); Yasuhiro Takano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/963,839

(22) Filed: Sep. 26, 2001

(65) Prior Publication Data

US 2002/0041038 A1 Apr. 11, 2002

(30) Foreign Application Priority Data

Oct. 10, 2000 (JP) ...................................... P2000-308623

(51) Int. Cl.[7] .............................................. H01L 23/12
(52) U.S. Cl. ........................................................ 257/704
(58) Field of Search ................................ 257/704, 529, 257/703, 710, 713, 794

(56) References Cited

U.S. PATENT DOCUMENTS 4,651,192 A * 3/1987 Matsushita et al. ............ 357/74
5,397,918 A * 3/1995 Yokochi et al. ............... 257/703
5,923,958 A    7/1999 Chou
6,100,108 A * 8/2000 Mizuno et al. ................ 438/51
6,255,376 B1 * 7/2001 Shikata et al. ................ 524/404
6,285,067 B1 * 9/2001 Hyoudo et al. ............... 257/529
6,313,525 B1 * 11/2001 Sasano ......................... 257/704

FOREIGN PATENT DOCUMENTS

| DE | 19752196   | 2/1999  |            |
|----|------------|---------|------------|
| DE | 19959938   | 10/2000 |            |
| EP | 0997934    | 5/2000  |            |
| JP | 01134956   | 5/1989  |            |
| JP | HEI10-173117 | 6/1998 | ........... H01L/25/50 |

* cited by examiner

*Primary Examiner*—David Nelms
*Assistant Examiner*—Quoc Hoang
(74) *Attorney, Agent, or Firm*—Fish & Richardson P.C.

(57) ABSTRACT

The present invention comprises a first main face (22a) on a surface side of a substrate (21a). An island portion (26) is formed on the first main face (22a) and a semiconductor chip (29), etc. are adhered thereto. The semiconductor chip (29), etc. are sealed in the hollow portion that is constructed by a column portion (23) and a transparent glass plate (36). Then, the column portion (23) and the transparent glass plate (36) are adhered by epoxy resin, or the like.

5 Claims, 9 Drawing Sheets

Figure 1A:
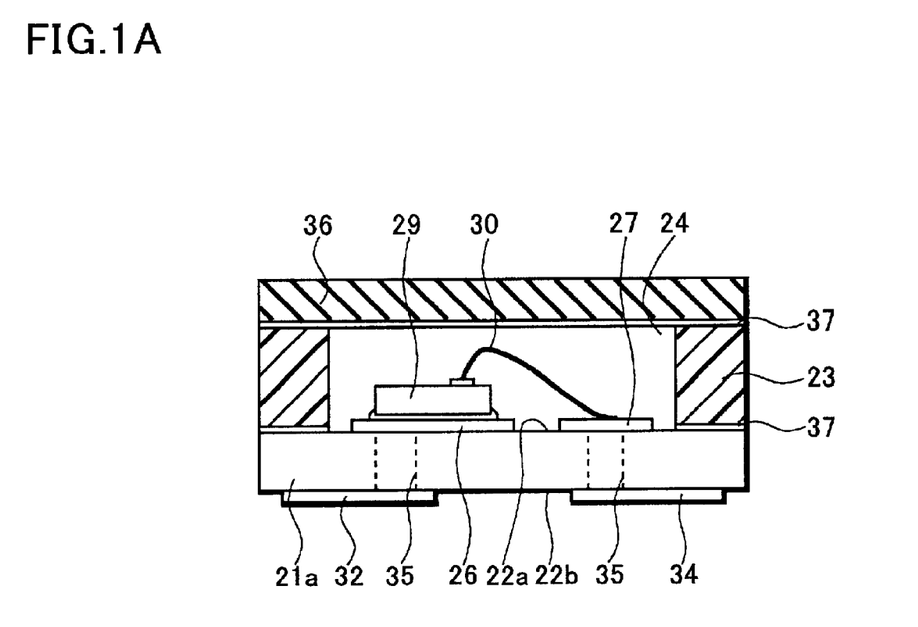
Figure 1B:
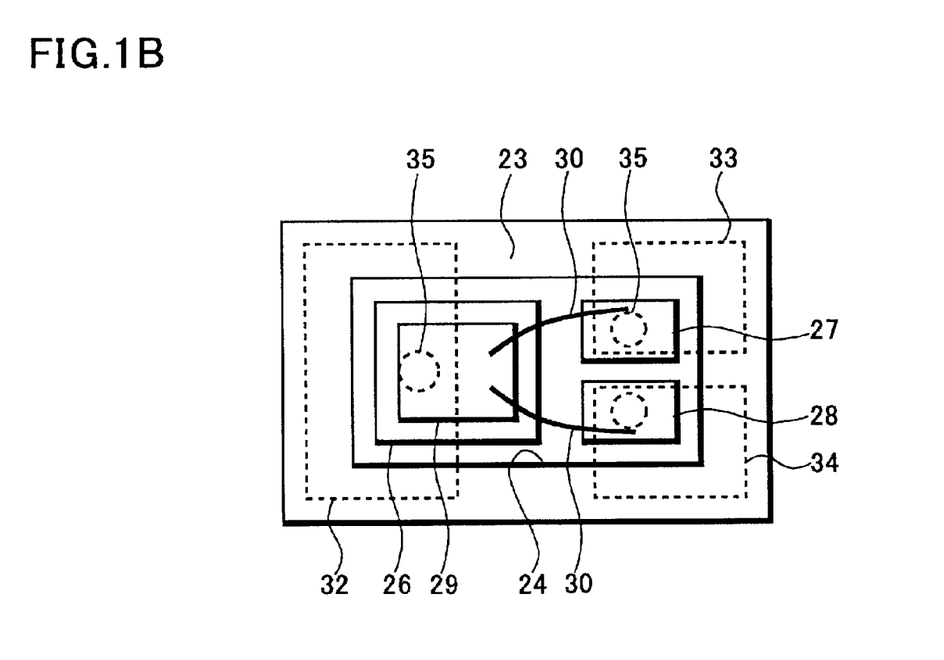

SEMICONDUCTOR DEVICE AND MANUFACTURING METHOD THEREOF

BACKGROUND OF THE INVENTION

The present invention relates to a semiconductor device that includes a semiconductor element for high frequency applications and an overcurrent-protecting function in a hollow airtight package and a method of manufacturing the same.

An example of the semiconductor device employing the hollow package in the conventional art is shown in FIG. 9. This electronic parts comprise a base substrate 1 formed of ceramic, etc., a lead 2 for external connection, and a cap 3 formed similarly of ceramic. A semiconductor chip 5 is adhered onto a surface of an element mounting portion 4 of the lead 2, then the semiconductor chip 5 and the lead 2 are connected via bonding wires 6, and then the semiconductor chip 5 is sealed in an airtight space 7 constructed by the cap 3 (for example, Patent Application Publication Hei 10-173117).

Such parts are manufactured via steps of preparing the lead 2 in the form of a lead frame, then bonding the semiconductor chip 5 to the lead frame via die bonding or wire bonding, then mounting the base substrate 1 on a bottom surface of the lead frame, then mounting the cap 3 on the base substrate 1 to put the leads 2 between them, and then cutting/shaping the leads 2.

However, in the semiconductor device in the conventional art, there is the subject that, since the base substrate 1 and the cap 3 are mounted on the lead frame every element, the manufacturing steps become complicated and are not suited for the mass production.

Also, there is the problem that, since the semiconductor chip 5 is sealed in the airtight space 7 that is constructed by the cap 3 made of ceramic, etc., the adhesion state cannot be checked by the visual inspection and thus it is difficult to remove the semiconductor device in which the adhesion failure is caused.

In addition, there is the problem that, since the above semiconductor device has the structure to project the lead 2 from the base substrate 1, a packaging area is large when such semiconductor device is packaged onto the printed circuit board.

Further, in the recent electronic devices such as the mobile telephone, etc. that have the portability and are driven by the rechargeable battery, measure must be taken to improve the reverse connection of the power supply in the charging operation. In such case, an overcurrent protection element is indispensable. But, in the conventional art, there is no overcurrent protection element that meets the light weight and the small size. Thus, there is the drawback that the increase in size of the electronic device is brought about.

SUMMARY OF THE INVENTION

A semiconductor device of the present invention has been made in view of the above circumstances, and comprises a supporting substrate made of insulating material, conductive patterns provided on a surface of the supporting substrate, and external connecting terminals connected electrically to the conductive patterns and provided on a back surface, a circuit element provided on the conductive patterns of the supporting substrate, and a glass plate adhered to cover the circuit element and to from a hollow airtight portion between the supporting substrate and the glass plate.

Preferably, the semiconductor device of the present invention, the glass plate is employed to seal the semiconductor element in the hollow airtight portion. Therefore, the adhered state can be checked by the visual inspection, and also the removal of the semiconductor device in which the adhesion failure is caused can be facilitated.

Preferably, the semiconductor device of the present invention, the via holes are provided in the substrate. Then, internal elements can be connected electrically to the external connecting terminals, whereby no lead extended from the substrate to the outside is needed. Therefore, the packaging area can be reduced extremely when the semiconductor devices are packaged onto the printed board.

In order to overcome the above subjects, a semiconductor device manufacturing method of the present invention comprises a step of preparing a supporting substrate in which conductive patterns having a number of mounting portions thereon are provided on its surface and external connecting terminals are provided on its back surface, a step of fixing a circuit element onto respective mounting portions, a step of adhering a glass plate to cover the circuit element and to form a hollow airtight portion between the supporting substrate and the glass plate every mounting portion, and a step of dividing the supporting substrate into respective mounting portions by dicing adhered portions between the supporting substrate and the glass plate.

According to the semiconductor device manufacturing method of the present invention, preferably the dividing step is the step of dicing the almost center of the column portion that surrounds the periphery of the concave portion provided every mounting portion. Therefore, the manufacturing steps can be simplified and the steps are suitable for the mass production.

BRIEF DESCRIPTION OF THE DRAWINGS

FIG. 1A is a sectional view of the semiconductor device according to the present invention and FIG. 1B is a plan view thereof;

FIG. 2A is a sectional view of the overcurrent-protecting device according to the present invention and FIG. 2B is a plan view thereof;

FIGS. 3A and 3B are perspective views showing the present invention;

FIGS. 4A and 4B are perspective views showing the present invention;

FIG. 5 is a perspective view showing the present invention;

FIGS. 6A and 6B are perspective views showing the present invention;

FIGS. 7A and 7B are perspective views showing the present invention;

FIGS. 8A and 8B are perspective views showing the present invention;

FIG. 9A is a sectional view of a conventional semiconductor device and FIG. 9B is a plan view thereof.

DETAILED DESCRIPTION OF THE PREFERRED EMBODIMENT

Embodiments of the present invention will be explained in detail with reference to the drawings hereinafter.

FIG. 1A is a sectional view and FIG. 1B is a plan view showing an embodiment of the semiconductor device of the present invention. A substrate 21*a* divided from a large-sized substrate 21 is formed of insulating material such as ceramic, glass epoxy, etc., and has a plate thickness of 100 to 300 μm and a rectangular shape whose long side×short side is about 2.5 mm×1.9 mm when it is viewed as a plan view (viewed as shown in FIG. 1B). Also, the substrate 21a has a first main face 22a on the surface side and a second main face 22b on the back surface side respectively, and these faces extend in parallel with each other. A column portion 23 is an pillar portion that is provided on an outer periphery of the substrate 21a to have a height of about 0.4 mm and a width of about 0.5 mm. A concave portion 24 is formed on the center portion of the substrate 21a by the column portion 23. The substrate 21a and the column portion 23 both are formed as separate members are adhered by the adhesive 37. In this case, the substrate 21a and the column portion 23 both are integrated together previously may be employed.

A surface of the first main face 22a of the substrate 21a is formed flat, and an island portion 26 and electrode portions 27, 28 are formed on the surface by conductive patterns such as the gold plating, or the like. Then, a semiconductor chip 29 such as a Schottky barrier diode, a MOSFET element, or the like, for example, is die-bonded to the island portion 26 of the substrate 21a. An electrode pad formed on a surface of the semiconductor chip 29 and the electrode portions 27, 28 are connected by bonding wires 30.

External connecting terminals 32, 33, 34 are formed on the surface of the second main face 22b of the substrate 21a by the conductive patterns such as the gold plating, or the like. In addition, a via hole 35 that passes through the substrate 21a from the first main face 22a to the second main face 22b is provided in the electrode portions 32, 33, 34. An inside of the via hole 35 is filled with conductive material such as tungsten, silver, copper, or the like, so that the island portion 26, the electrode portion 27, and the electrode portion 28 are connected electrically to the external connecting terminal 32, the external connecting terminal 33, and the external connecting terminal 34 respectively. End portions of the external connecting terminals 32, 33, 34 are retreated from the end portion of the substrate 21a by about 0.01 to 0.1 mm. Also, since upper surfaces of the via holes 35 of the electrode portion 27, 28 are not flat, it is preferable that the bonding wire 30 should be connected to avoid the upper surfaces of the via holes 35 of the electrode portion 27, 28 respectively. The external connecting terminals 32, 33, 34 are formed in advance on the large-sized substrate 21.

A transparent glass plate 36 whose plate thickness is about 0.1 to 0.3 mm is adhered/fixed to the upper portion of the column portion 23 by the adhesive 37 to form an inside of the concave portion 24 as a closed space. As a result, the semiconductor chip 29 and the metal thin wires 30 are housed perfectly in the airtight space. In this case, the adhesive 37 is previously applied to the overall adhered surface of the glass plate 36.

The column portion 23 cut by the dicing surrounds the peripheral area of the semiconductor chip 29, and the cut glass plate 36 closes tightly the upper area thereof. The column portion 23 and the first main face 22a of the substrate 21a are adhered by the adhesive 37, and the column portion 23 and the glass plate 36 are adhered by the adhesive 37. As a result, the semiconductor chip 29 and the metal thin wires 30 are housed in the airtight space constructed by the concave portion 24. Outer peripheral end surfaces of the substrate 21a, the column portion 23, and the glass plate 36 are cut by the dicing so as to form flat cut end surfaces.

The above semiconductor device is mounted such that the external connecting terminals 32, 33, 34 are opposed/adhered to the electrode patterns on the packaging substrate.

Here, an embodiment in which respective semiconductor chips that are adhered onto respective mounting portions are covered with a common resin layer by covering a resin layer with the substrate will be explained in brief.

The large-sized substrate in which a plurality of mounting portions are arranged in a matrix fashion, e.g., 100 portions are arranged in 10 rows and 10 columns, on the substrate having the plate thickness of 200 to 350 μm that can maintain the mechanical strength during the manufacturing steps is prepared. The substrate is an insulating substrate made of ceramic, glass epoxy, or the like. Then, the semiconductor chips are die-bonded to respective mounting portions and then all semiconductor chips are covered with the common resin layer by dropping (potting) epoxy liquid resin by a predetermined amount. After the dropped resin layer is cured by the heat treatment executed at 100 to 200 degree for several hours, a surface of the resin layer is worked into a flat surface by grinding curved surfaces. In the grinding, the grind apparatus is used to grind the surface of the resin layer by the grind blade such that the surface of the resin layer has a uniform height from the substrate. In this step, a film thickness of the resin layer is formed to 0.3 to 1.0 mm.

Figure 2A:
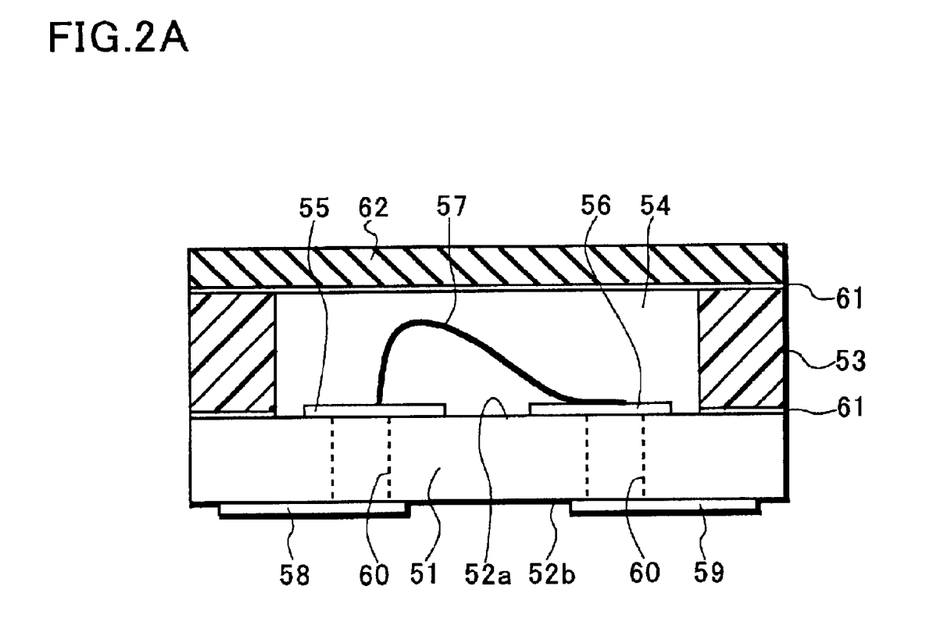
Figure 2B:
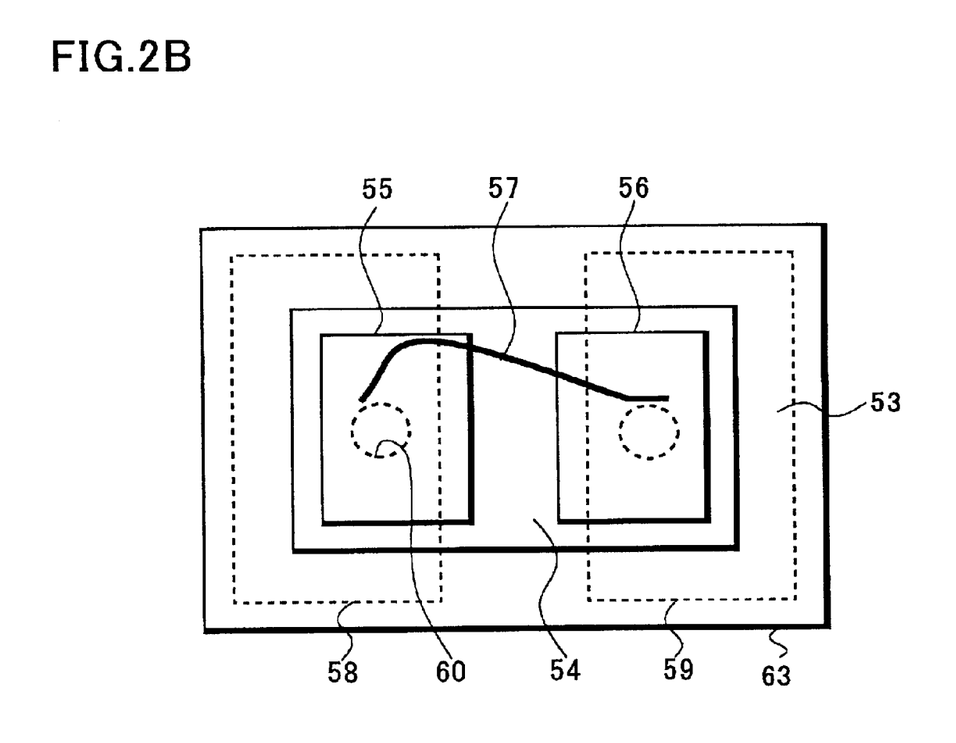

Next, FIG. 2A is a sectional view and FIG. 2B a plan view showing an embodiment of an overcurrent-protecting device using a fuse. A substrate 51 is formed of insulating material such as ceramic, glass epoxy, etc. The substrate 51 has a plate thickness of 100 to 300 μm and a rectangular shape whose long side×short side is about 2.5 mm×1.9 mm when it is viewed as a plan view (viewed as shown in FIG. 2B). Also, the substrate 51 has a first main face 52a on the surface side and a second main face 52b on the back surface side respectively. A column portion 53 is an side portion that is provided on an outer periphery of the substrate 51 to have a height of about 0.4 mm and a width of about 0.5 mm. A concave portion 54 is formed on the center portion of the substrate 51 by the column portion 53. The substrate 51 and the column portion 53 both are formed as separate members are adhered by the adhesive 61. In this case, the substrate 51 and the column portion 53 both are integrated together previously may be employed.

A surface of the first main face 52a of the substrate 51 is formed flat, and electrode portions 55, 56 are formed on the surface by conductive patterns such as the gold plating, or the like. A metal thin wire 57 having a diameter of 30 μm, for example, is provided between the electrode portions 55, 56 by the wire bonding. The metal thin wire 57 is formed of a gold wire having a purity of 99.99%, a solder thin wire, or the like. The metal thin wire 57 is first bonded to the electrode portion 55 and is second bonded to the electrode portion 56 such that a wire loop is formed to have a height smaller than a height of the concave portion 54.

External connecting terminals 58, 59 are formed on the surface of the second main face 52b of the substrate 51 by the conductive patterns such as the gold plating, or the like. In addition, a via hole 60 passing through the substrate 51 is provided under the electrode portions 55, 56 respectively. An inside of the via hole 60 is filled with conductive material such as tungsten, or the like, so that the electrode portion 55 and the electrode portion 56 are connected electrically to the external connecting terminal 58 and the external connecting terminal 59 respectively. End portions of the external connecting terminals 58, 59 are retreated from the end portion of the substrate 51 by about 0.01 to 0.1 mm. Also, since upper surfaces of the via holes 60 of the electrode portion 55, 56 are not flat, it is preferable that the bonding wire 57 should be connected to avoid the upper surfaces of the via holes 60 of the electrode portion 55, 56 respectively.

A transparent glass plate 62 whose plate thickness is about 0.1 to 0.3 mm is adhered/fixed to a surface of the column portion 53 by the adhesive 61 to form an inside of the concave portion 54 as a closed space. As a result, the metal thin wire 57 is housed perfectly in the airtight space. In this case, the adhesive 61 is previously applied to the overall adhered surface of the glass plate 62.

The above overcurrent-protecting device is mounted such that the external connecting terminals 58, 59 are opposed/adhered to the electrode patterns on the packaging substrate. When an overcurrent in excess of the rated current is flown between the external connecting terminals 58, 59, such overcurrent flows through the metal thin wire 57 to cause the rapid temperature rise due to the specific resistance of the metal thin wire 57. The metal thin wire 57 is melt down by this heat generation to perform a protection function against the overcurrent. If a gold (Au) wire having the diameter of 30 μm and a wire length of about 0.7 mm is employed, the fusing current is about 4 A (1 to 5 seconds). In many cases, because of the relationship between the radiation and the resistance, the metal thin wire 57 is melt down in its middle portion rather than its end portions close to the electrode portions 55, 56. At this time, since the fused portion does not contact to other material such as the resin, the device in which the ignition, the emitting smoke, the change of color, and the deformation are not generated in appearance can be obtained. Also, since the metal thin wire 57 is melted down, the device in which both terminals are disconnected perfectly at the time of the overcurrent can be formed.

The fuse element can be formed by forming a part of the conductive patterns constituting the electrode portions 55, 56 as a narrow wedge-like shape successively, by adhering a polysilicon resistor to the metal thin wire, or the like in addition to the metal thin wire. In summary, any means may be employed if the fused portion is housed in the concave portion 54. Also, although the concave portion 54 is airtightly closed in the air, the incombustible gas to form the nitrogen atmosphere, etc., for example, can be filled therein.

As described above, according to the semiconductor device of the present invention, the transparent glass plate 36 is employed to seal hermetically the semiconductor chip 29, the bonding wire 30, etc. in the concave portion. As a result, the adhered states between the glass plate 36 and the column portion 23 can be checked by the visual inspection, and also the removal of the semiconductor device in which the adhesive failure is caused can be facilitated.

In addition, in the semiconductor device of the present invention, the hollow structure can be formed by employing the column portion 23 and the glass plate 36, and also the semiconductor chip 29, etc. that are die-bonded onto the substrate 21a are housed in the airtight space constructed by the concave portion 24 as the hollow portion. Accordingly, a material cost can be lowered extremely in contrast to the case where the substrate 21a is covered with the resin layer and therefore the semiconductor chips 29 adhered onto the mounting portions are covered with the resin layer.

Further, in the semiconductor device of the present invention, the hollow structure can be formed by using the column portion 23 and the glass plate 36 and also the step of planarizing the surface of the semiconductor element is not needed because the glass plate 36 is employed as the lid body of the hollow structure. Therefore, a production cost can be lowered extremely rather than the case where the substrate 21a is covered with the resin layer and therefore the semiconductor chips 29 adhered onto the mounting portions are covered with the resin layer.

Besides, the via holes 35 passing through the substrate 21a from the first main face 22a to the second main face 22b are formed in the substrate 21a. Then, the insides of the via holes 35 are filled with the conductive material such as tungsten, silver, copper, etc., and also the island portion 26, the electrode portion 27, and the electrode portion 28 are connected electrically to the external connecting terminals 32, 33, 34 respectively, so that internal elements and the external connecting terminals can be connected electrically with no lead that is extended from the substrate 21a to the outside. Therefore, a packaging area can be reduced extremely when the semiconductor device is packaged onto the printed board.

A first manufacturing method of the semiconductor device shown in FIG. 1 will be explained in detail hereinafter.

First step: See FIG. 3A

Figure 3A:
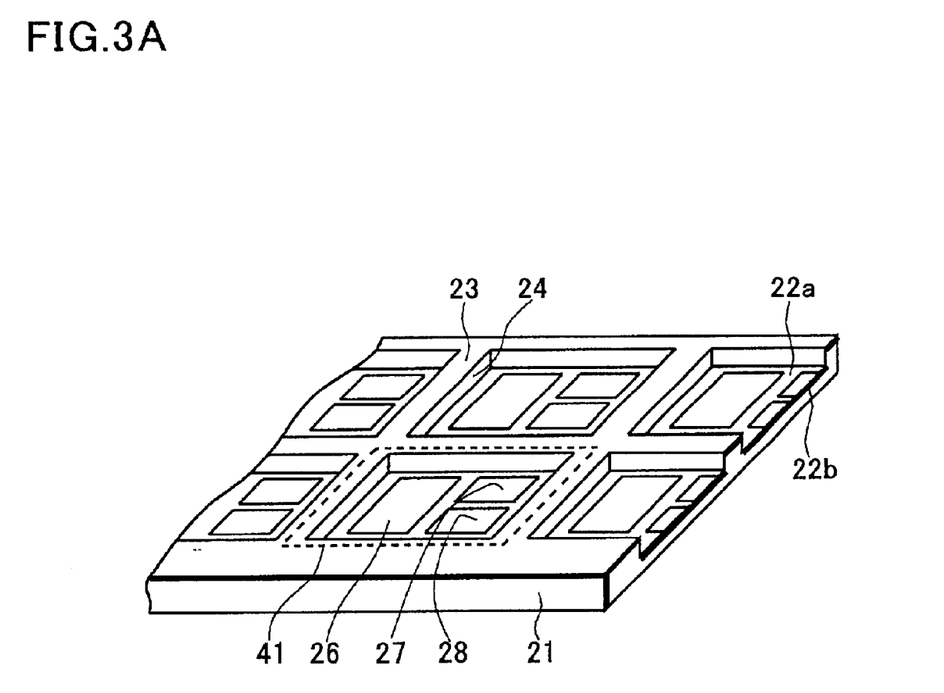

At first, the large-sized substrate 21 is prepared. The large-sized substrate 21 is formed of insulating material such as ceramic, glass epoxy, etc. and has a plate thickness of 100 to 300 μm. Also, the large-sized substrate 21 has the first main face 22a on the surface side and the second main face 22b on the back surface side respectively. A symbol 23 is a lattice-like column portion having a height of 0.1 to 0.5 mm and a constant width of about 0.25 to 0.5 mm, and forms the concave portion 24 in which the center portion of the substrate 21 is depressed by the column portion 23. The substrate 21 and the column portion 23 are formed integrally in advance to form the above plate thickness including the column portion 23. In this case, the structure in which the substrate 21 and the column portion 23 are formed individually and then adhered/fixed together may be prepared.

The concave portions 24 each having a size of about 0.8 mm×0.6 mm, for example, are arranged at an equal distance vertically and laterally on the substrate 21. A large number of sets of the island portions 26 and the electrode portions 27, 28 are drawn on the first main faces 22a of the concave portions 24 by the conductive patterns formed of the gold plating. The concave portion 24 and a part of the column portion 23 of the substrate 21 surrounding the concave portion 24 constitute the element mounting portion 41.

Second step: See FIG. 3B

Figure 3B:
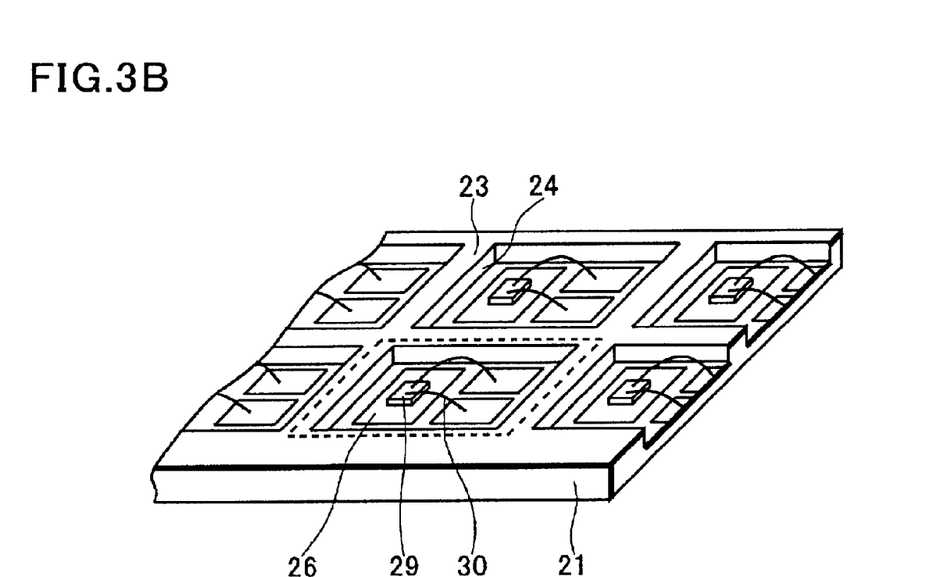

After such substrate 21 is prepared, the semiconductor chip 29 is die-bonded to the island portion 26 every concave portion 24 and the bonding wire 30 is wire-bonded. Then, one sides of the bonding wires 30 that are wire-bonded to the semiconductor chip 29 are connected to the electrode portions 27, 28. A loop height of the bonding wire 30 at this time is set to a height that is lower than a height of the column portion 23.

Third step: See FIG. 4A

Figure 4A:
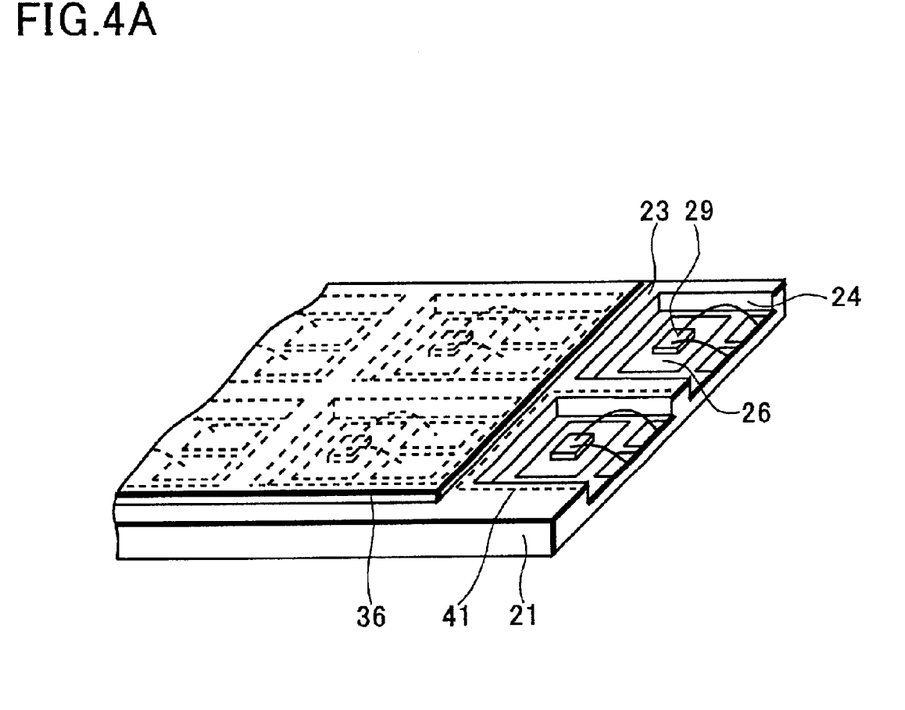

A transparent glass plate 36 having a plate thickness of about 0.1 to 0.3 mm is prepared, and then respective concave portions 24 are sealed by the glass plate 36 by adhering this glass plate 36 on the column portion 23 that is extended over a plurality of mounting portions 41. The adhesive such as epoxy adhesive is employed to adhere. Accordingly, the semiconductor chip 29 and the bonding wire 30 can be housed perfectly in the airtight space. In this case, the adhesive 37 is previously applied to the overall adhered surface of the glass plate 36.

After this, it is visually checked whether or not the adhesion failure is caused between the column portion 23 and the glass plate 36.

Fourth step: See FIG. 4B

Figure 4B:
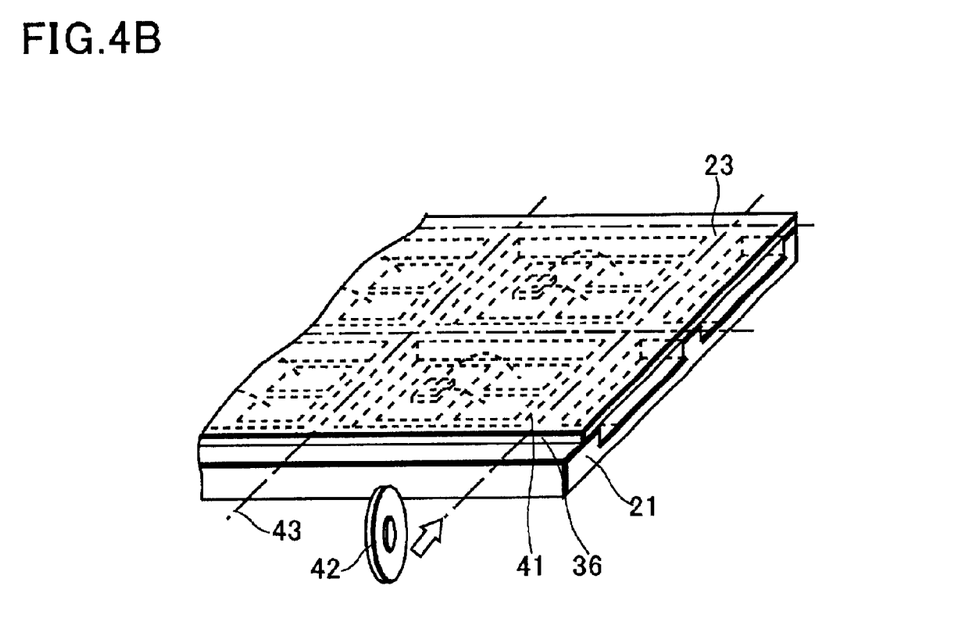
Figure 5:
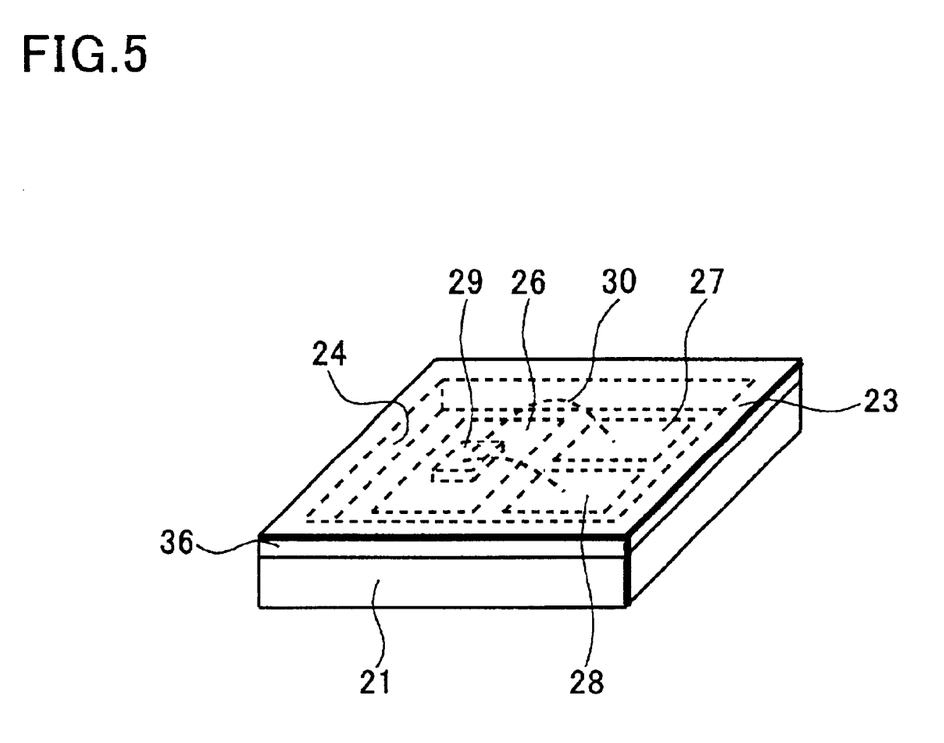

Then, individual devices shown in FIG. 5 can be obtained by dividing the substrate 21 into respective mounting portions 41 based on alignment marks formed on the surface of the substrate 21. A dicing blade 42 is used to divide, and a dicing sheet is pasted on the back surface side of the substrate 21 and then the substrate 21 and the glass plate 36 are collectively cut away along dicing lines 43 vertically and laterally. In this case, the dicing line 43 is positioned in the center of the column portion 23. Also, the dicing sheet may be pasted on the glass plate 36 side and then the dicing may be applied from the second main face 22b side.

A second manufacturing method of the semiconductor device shown in FIG. 1 will be explained in detail hereinafter. This is the case where the column portion 23 is constructed as the discrete parts.

First step: See FIG. 6A

Figure 6A:
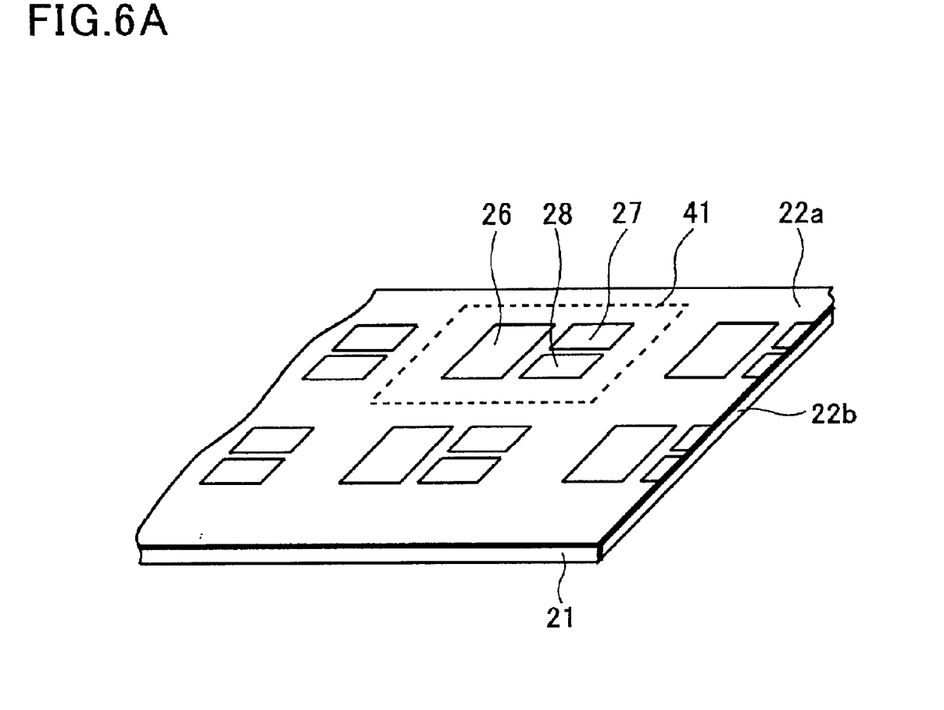

At first, the large-sized flat substrate 21 is prepared. The large-sized substrate 21 is formed of insulating material such as ceramic, glass epoxy, etc. and has a plate thickness of 100 to 300 μm. Also, the large-sized substrate 21 has the first main face 22a on the surface side and the second main face 22b on the back surface side respectively. A large number of sets of the island portions 26 and the electrode portions 27, 28 are drawn on the surface of the first main faces 22a by the conductive patterns formed of the gold plating. The area that surrounds the island portion 26 and the electrode portions 27, 28 constitutes the element mounting portion 41. A large number of element mounting portions 41 are arranged at an equal distance vertically and laterally.

Second step: See FIG. 6B

Figure 6B:
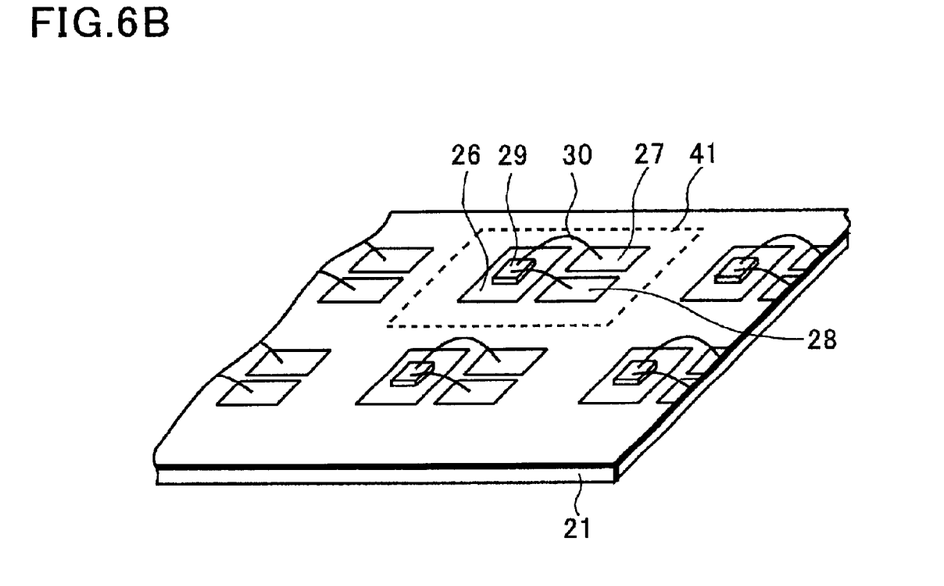

After such substrate 21 is prepared, the semiconductor chip 29 is die-bonded to the island portion 26 every element mounting portion 41 and the bonding wire 30 is wire-bonded. Then, one sides of the bonding wires 30 that are wire-bonded to the semiconductor chip 29 are connected to the electrode portions 27, 28. A loop height of the bonding wire 30 at this time is set to a height that is smaller than a depth of the concave portion 24.

Third step: See FIG. 7A

Figure 7A:
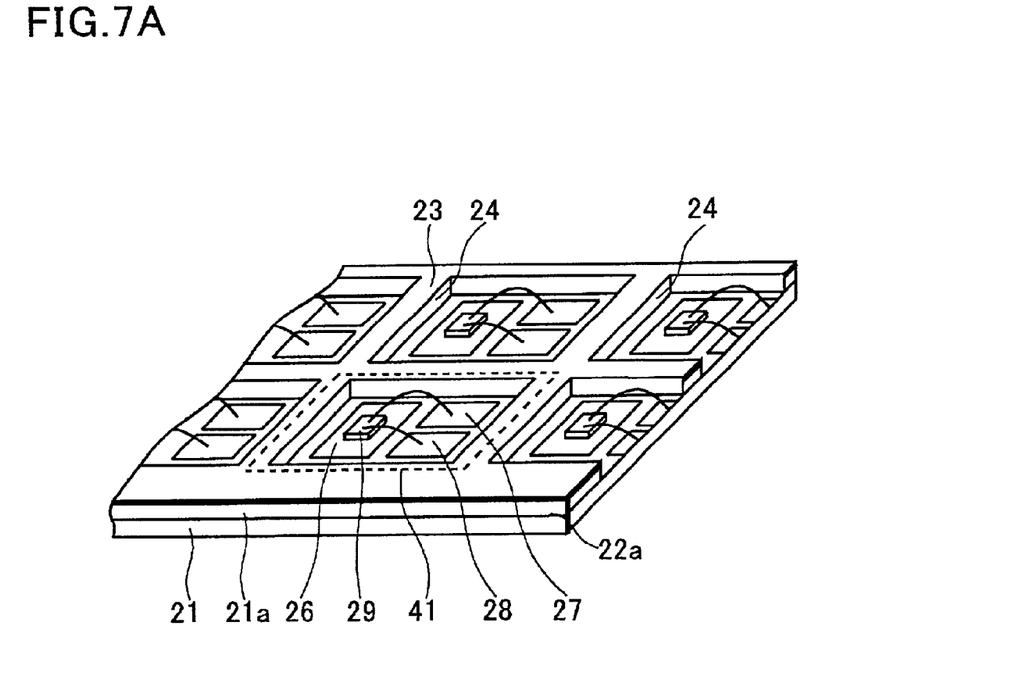

The second substrate 21a having the concave portions 24 (through holes) at positions that correspond to the element mounting portions 41 is adhered/fixed to the surface of the first main face 22a on the substrate 21 to which the die bonding and the wire bonding have been applied. The adhesive such as epoxy adhesive, etc. is employed to adhere.

The concave portions 24 each having a size of about 0.8 mm×0.6 mm, for example, are arranged at an equal distance vertically and laterally on the second substrate 21b. The column portion 23 having a height of about 0.1 to 0.2 mm and a width of about 0.2 to 0.5 mm is provided between the concave portions 24 so as to surround the concave portion 24 in a lattice fashion. As a result, the island 26, the semiconductor chip 29, the electrode portions 27, 28, etc. are exposed from the concave portion 24, which is equivalent to the state in FIG. 3B. According to this approach, since the die bonding and the wire bonding can be applied to the flat substrate 21, the contact between the vacuum collet or the bonding tool and the column portion 23 can be eliminated and thus a dimension of the concave portion 24 can be reduced.

Fourth step: See FIG. 7B

Figure 7B:
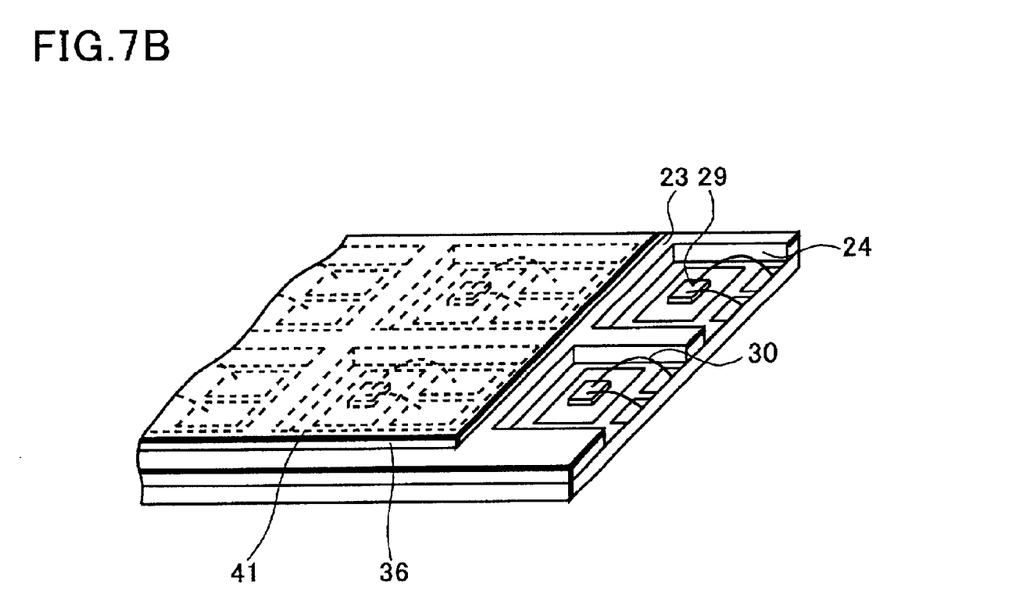

A transparent glass plate 36 having a plate thickness of about 0.1 to 0.3 mm is prepared, and then respective concave portions 24 are sealed by the glass plate 36 by adhering this glass plate 36 on the column portion 23 that is extended over a plurality of mounting portions 41. The adhesive such as epoxy adhesive or glass adhesive is employed to adhere.

Accordingly, the semiconductor chip 29 and the bonding wire 30 can be housed perfectly in the airtight space. In this case, the adhesive 37 is previously applied to the overall adhered surface of the glass plate 36.

After this, it is visually checked whether or not the adhesion failure is caused between the column portion 23 and the glass plate 36.

Fifth step: See FIG. 8A

Figure 8A:
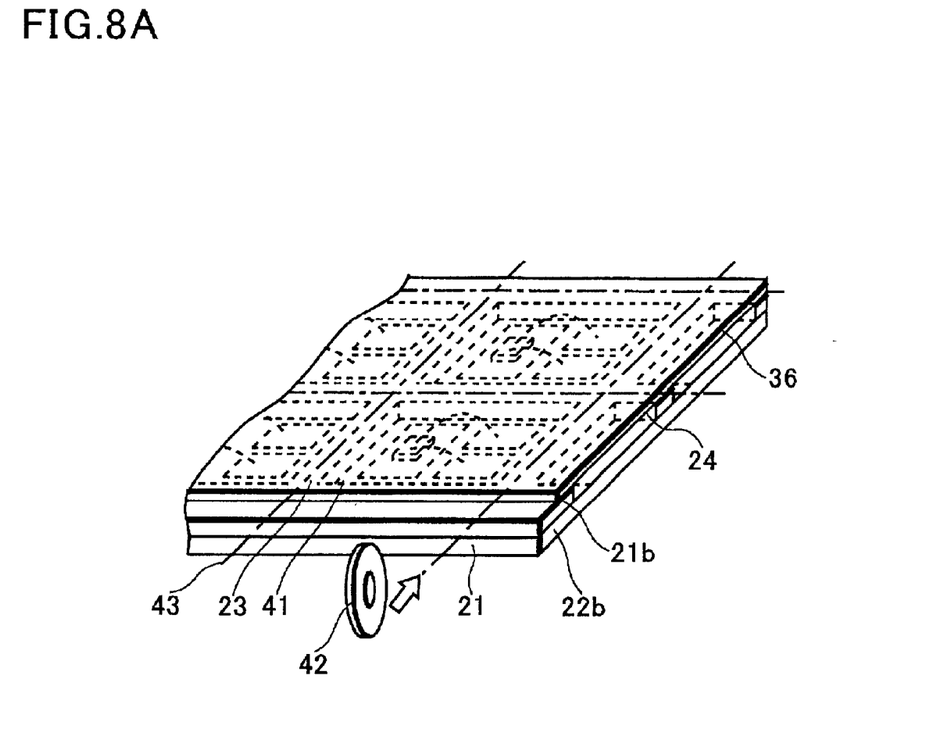
Figure 8B:
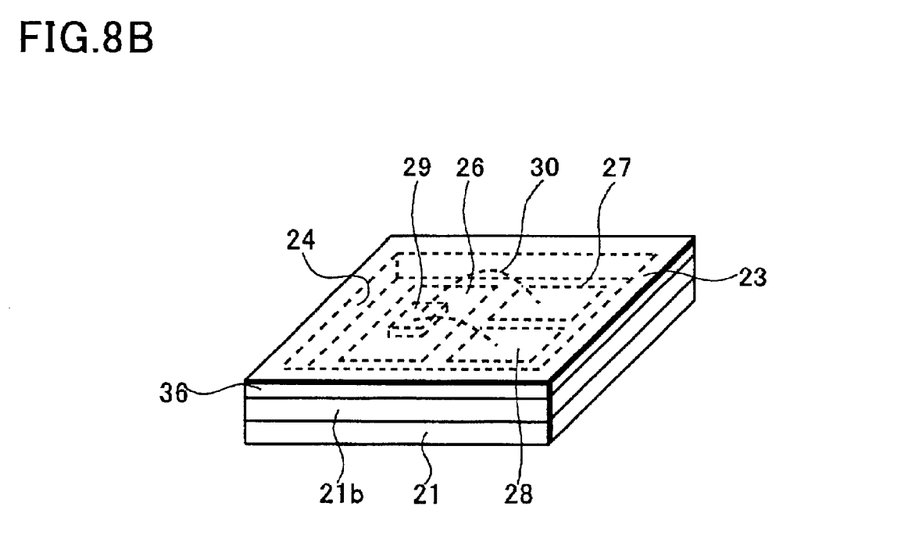
Figure 9A:
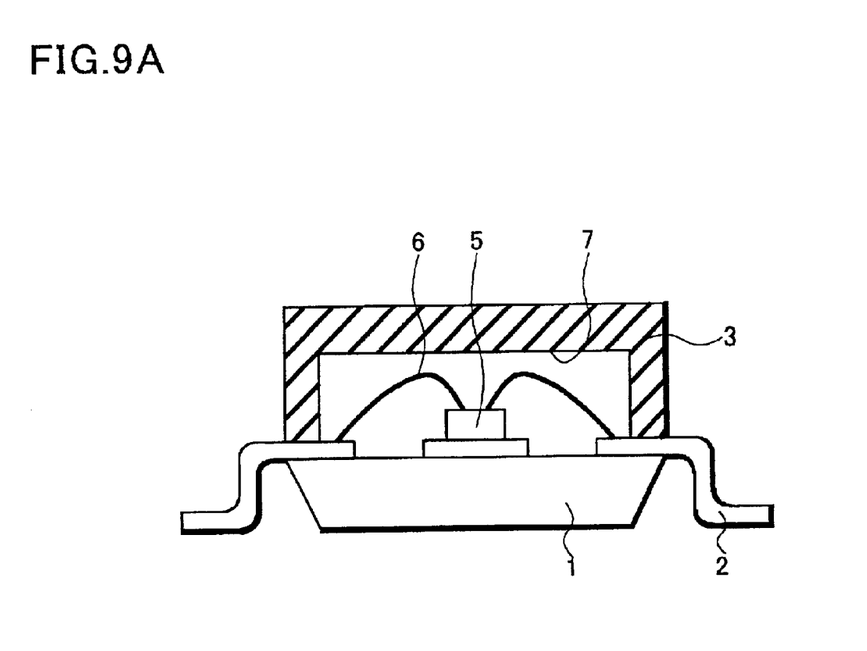
Figure 9B:
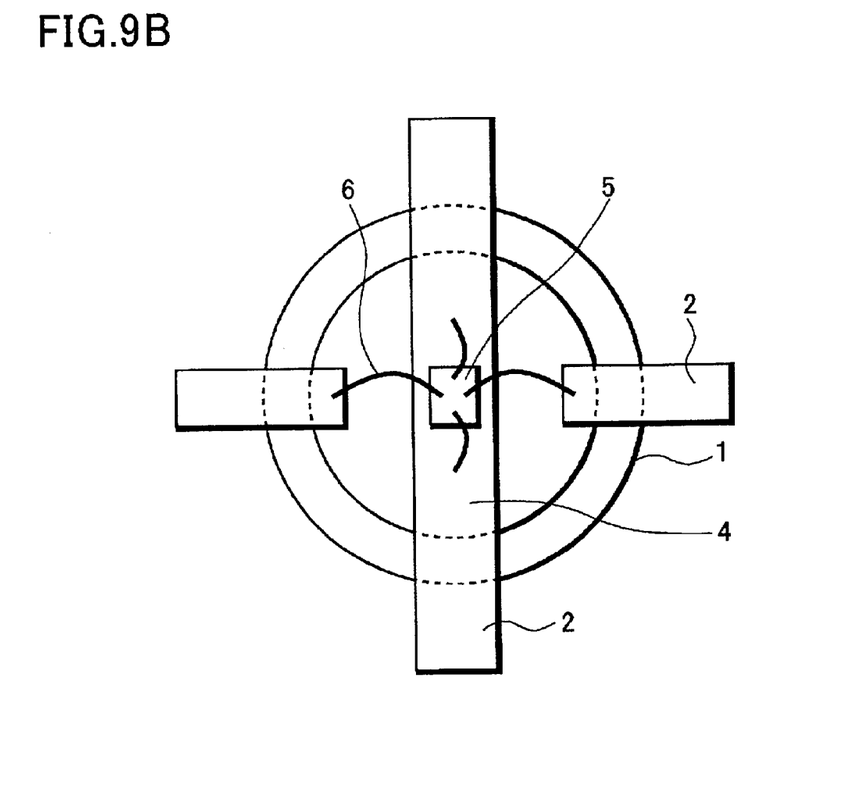

Then, individual devices shown in FIG. 8B can be obtained by dividing the substrate 21 into respective mounting portions 41 based on alignment marks formed on the surface of the substrate 21. The dicing blade 42 is used to divide, and the dicing sheet is pasted on the second main face 22b side of the substrate 21 and then the substrate 21, the second substrate 21b, and the glass plate 36 are collectively cut away along the dicing lines 43 vertically and laterally. In this case, the dicing line 43 is positioned in the center of the column portion 23. Also, the dicing may be applied from the second main face 22b side.

As described above, according to the present invention, the transparent glass plate is employed to seal the semiconductor chip, the bonding wire, etc. in the hollow airtight portion. Therefore, the adhered state of the glass plate and the column portion can be checked by the visual inspection, and also the removal of the semiconductor device in which the adhesion failure is caused can be facilitated.

Also, according to the semiconductor device of the present invention, the hollow structure can be formed on the substrate by using the column portion and the glass plate, and also the semiconductor device can be formed by adhering the semiconductor chip, etc. onto the hollow portion. Therefore, a material cost can be reduced extremely rather than the case where the substrate is covered with the resin layer and therefore the semiconductor chips adhered onto the mounting portions are covered with the resin layer.

In addition, according to the semiconductor device manufacturing method of the present invention, a plurality of semiconductor devices can be formed collectively and in addition the step of planarizing the surface of the semiconductor elements can be omitted by employing the glass plate as the lid body of the hollow package. Therefore, a fabrication cost can be reduced extremely.

Further, the via holes passing through the substrate from the first main face to the second main face are provided in the substrate. Then, the insides of the via holes are filled with the conductive material such as tungsten, silver, copper, etc. Thus, the island portion and the electrode portions can be connected electrically to the external connecting terminals and also internal elements can be connected electrically to the external connecting terminals, whereby no lead extended from the substrate to the outside is needed. Therefore, the mounting area can be reduced extremely when the semiconductor devices are packaged onto the printed board.

Besides, according to the semiconductor device manufacturing method of the present invention, a plurality of mounting portions are formed on the substrate, the concave portion is provided every mounting portion, the column portion surrounds the periphery of the mounting portion, and a plurality of semiconductor devices are formed on the substrate. Then, in the dividing step, individual semiconductor devices are formed by dicing the almost center of the column portion that surrounds a plurality of semiconductor devices formed on the substrate. Therefore, the manufacturing method of the present invention is suited for the mass production.

What is claimed is:

1. A semiconductor device comprising:
   a supporting substrate made of insulating material;
   a conductive pattern provided on a surface of the supporting substrate;
   an external connecting terminal provided on a back surface of the supporting substrate and electrically connected to the conductive patterns;
   a fuse element provided on the conductive pattern; and
   a transparent glass plate that covers the fuse element and that forms a hollow airtight portion between the supporting substrate and the transparent glass plate.

2. A semiconductor device according to claim 1, wherein the supporting substrate includes a flat supporting portion and a column portion, and the conductive patterns are provided on the flat supporting portion.

3. A semiconductor device according to claim 1, wherein the transparent glass plate is adhered onto the column portion.

4. A semiconductor device according to claim 1, wherein a via hole is provided in the supporting substrate, and the fuse element and the external connecting terminals are electrically connected through the via hole.

5. A semiconductor device according to claim 1, wherein the fuse element is formed of a metal wire.

* * * * *